United States Patent
Baker et al.

(10) Patent No.: US 6,606,483 B1
(45) Date of Patent: Aug. 12, 2003

(54) DUAL OPEN AND CLOSED LOOP LINEAR TRANSMITTER

(75) Inventors: Michael H. Baker, Elmhurst, IL (US); William J. Turney, Schaumburg, IL (US); Paul H. Gailus, Prospect Heights, IL (US)

(73) Assignee: Motorola, Inc., Schaumburg, IL (US)

( * ) Notice: Subject to any disclaimer, the term of this patent is extended or adjusted under 35 U.S.C. 154(b) by 527 days.

(21) Appl. No.: 09/686,732

(22) Filed: Oct. 10, 2000

(51) Int. Cl.[7] .................................................. H04B 1/04
(52) U.S. Cl. ........................ 455/126; 455/91; 455/115; 455/127
(58) Field of Search ................................. 455/126, 127, 455/115, 91, 116, 114, 102, 104, 108, 109, 111, 113, 118, 119, 125, 69; 330/129, 136, 284, 103, 107, 110, 149, 109

(56) References Cited

U.S. PATENT DOCUMENTS

| | | | | |
|---|---|---|---|---|
| 3,680,004 A | * | 7/1972 | Poussin | 455/113 |
| 5,054,116 A | * | 10/1991 | Davidson | 455/126 |
| 5,438,683 A | * | 8/1995 | Durtler et al. | 455/74 |
| 5,483,681 A | * | 1/1996 | Bergsten et al. | 455/126 |
| 5,559,468 A | * | 9/1996 | Gailus et al. | 330/110 |
| 5,945,876 A | * | 8/1999 | Jones | 330/51 |
| 6,353,359 B1 | * | 3/2002 | Leizerovich | 330/2 |
| 6,384,677 B2 | * | 5/2002 | Yamamoto | 330/10 |
| 2002/0132595 A1 | * | 9/2002 | Kokubo | 455/119 |

* cited by examiner

Primary Examiner—Pablo N Tran
(74) Attorney, Agent, or Firm—Steven A. May

(57) ABSTRACT

A linear transmitter includes an amplifier feedback loop for amplifying an input signal at a power amplifier. The feedback loop is operated in an open loop mode when the power amplifier is operating at a first operating point and is operated in a closed loop mode when the power amplifier is operating at a second operating point. The transmitter further includes an auxiliary loop coupled to the amplifier feedback loop that provides phase training for the feedback loop and power leveling when the feedback loop is operating open loop. Open loop phase training and power leveling is done during open loop transmission, without an associated training signal or training period. Stable closed loop operation can commence subsequently providing the higher power amplifier efficiency associated with the second operating point and maintaining off channel interference requirements.

25 Claims, 6 Drawing Sheets

DUAL OPEN AND CLOSED LOOP LINEAR TRANSMITTER

FIELD OF THE INVENTION

The present invention relates generally to communication devices, and in particular to a Radio Frequency amplifier portion of a communication device.

BACKGROUND OF THE INVENTION

The frequency spectrum that is shared among radio communication devices is limited. Thus the ability of a transmitter to transmit as much information as possible in an allocated frequency spectrum or channel without interfering with other communication devices in off channels is of great importance. To transmit as much information as possible in the allocated channel, digital communication systems typically modulate both the amplitude and phase of a radio frequency (RF) carrier. The amplitude modulation allows more information to be encoded on the carrier in a given channel than if only the phase was modulated. However, the amplitude modulation puts additional requirements on the transmitter that would not exist if only the phase of the RF carrier was modulated.

These additional requirements are due to the inherent nonlinear effects resulting from the amplification of an amplitude modulated signal by an RF power amplifier in a linear transmitter in the communication device. The nonlinear effects are due to the amplitude compression characteristics (AM/AM) and the phase distortion (AM/PM) characteristics of the RF power amplifier when it is driven over a range of amplitudes. If these non-linear characteristics are not compensated they will cause spreading of the spectrum into the off channels and thus interfere with communication devices using off channels.

One method of maintaining a high degree of transmitter linearity is to operate a transmitter, that is, a radio frequency (RF) amplifying element in the transmitter, at a highly linear bias such as a class A bias and to back off transmitter output power so as not to drive the RF amplifying element into amplitude compression. However, a drawback to class A bias operation is low efficiency. Efficiency is a measure of the level of conversion of input RF power and input DC power to output RF power. Class A bias amplifiers typically have efficiencies of well under 50% while class C (non-linear) bias amplifiers can approach 85% efficiency. The result of lower efficiency operation is greater power consumption to produce a desired level of output power, more limited RF output power for a given DC power source, and more complex thermal issues since an implication of lower efficiency is the dissipation of a greater percentage of the power consumed in the form of heat. These issues are critical when amplifier operation is constrained by battery life or when heat dissipation is constrained by transmitter size.

A number of prior art signal processing techniques have been developed to allow a transmitter to operate using a non-linear bias level and to compensate for the non-linearities introduced as a result of the non-linear bias level. Among these techniques are predistortion, adaptive predistortion, feedforward correction loops and feedback correction loops. Predistortion and adaptive predistortion seek to inject a predistorted signal into an input signal's path prior to amplification. The predistorted signal includes components equal and opposite to the distortion introduced by the power amplifier and is designed to cancel the distortion introduced to the input signal by the power amplifier. However, the application of a predistorted injection signal is limited due to the difficulty of characterizing a power amplifier and correcting for the power amplifier's characteristics with a predetermined function. Feedback and feedforward are real time correction techniques and therefore do not require characterization of the power amplifier. However, feedforward correction includes costly error amplifiers, which may also introduce distortion into the feedforward path, and additional system expense and complexity such as carefully matched delays between the input signal forward path and the feedforward loop. Therefore, a technique commonly used to improve transmitter linearity is negative feedback correction. Typically, in negative feedback correction, a feedback signal from a Cartesian feedback loop in the transmitter is combined with an input signal sourced to the transmitter by a signal source to correct distortion introduced to the input signal by the transmitter's amplification circuitry.

Many Cartesian feedback systems require an initialization period, and subsequent periodic training periods, to train the feedback loop. That is, when a transmitter using Cartesian feedback begins transmitting, the phase shift of the feedback path in the feedback loop must be adjusted, or trained, so that the feedback signal is properly out-of-phase with the input signal and will cancel out the distortion introduced to the input signal by the amplification circuitry. During such training periods, the transmitter runs open loop because of the potential for transmitter instability prior to the alignment of the phase shift of the feedback path. However, running open loop eliminates the negative feedback correction provided by the feedback path, allowing for the uncompensated transmission by the transmitter of distortions introduced to the input signal and resulting in spectral spreading.

Furthermore, in amplitude modulation schemes such as quadrature amplitude modulation (QAM), the input signal is usually a baseband quadrature signal that includes an in-phase (I) component and a quadrature (Q) component. Quadrature signals can be represented in a complex (I/Q) plane as a vector, which vector includes an in-phase (I) component and a quadrature (Q) component. A measure of linearity is how closely the in-phase and quadrature components of a transmitted signal, or vector, matches the in-phase and quadrature components of the input signal, another vector, wherein the difference between the two vectors constitutes an error vector. During the open loop training period of a transmitter that uses a Cartesian feedback loop, it is possible to produce significant error vectors.

New cellular system standards such as Enhanced Datarates for Global Evolution (EDGE) require that the transmitted signal be highly linear from the outset. EDGE imposes stringent requirements with respect to a coupling of power into off channel frequencies and to a magnitude of an error vector (EVM), and does not provide for an initialization period during which a communication device with a Cartesian feedback transmitter may run open loop and train with dedicated training signals. As a result, in order to meet the EDGE requirements, the communication device must run open loop with a highly linear bias level and must operate the RF amplifying element with significant power back off below a gain compression point. However, this reintroduces the issue of low efficiency that is overcome by operating closer to compression and using a distortion compensation technique.

Therefore, a need exists for a method and apparatus that provides the higher efficiency of a non-linear bias level combined with negative feedback correction and that meets the stringent off channel and error vector magnitude (EVM)

requirements of cellular standards that do not allow for the initialization period required for a Cartesian feedback transmitter.

DETAILED DESCRIPTION OF THE INVENTION

Figure 1:
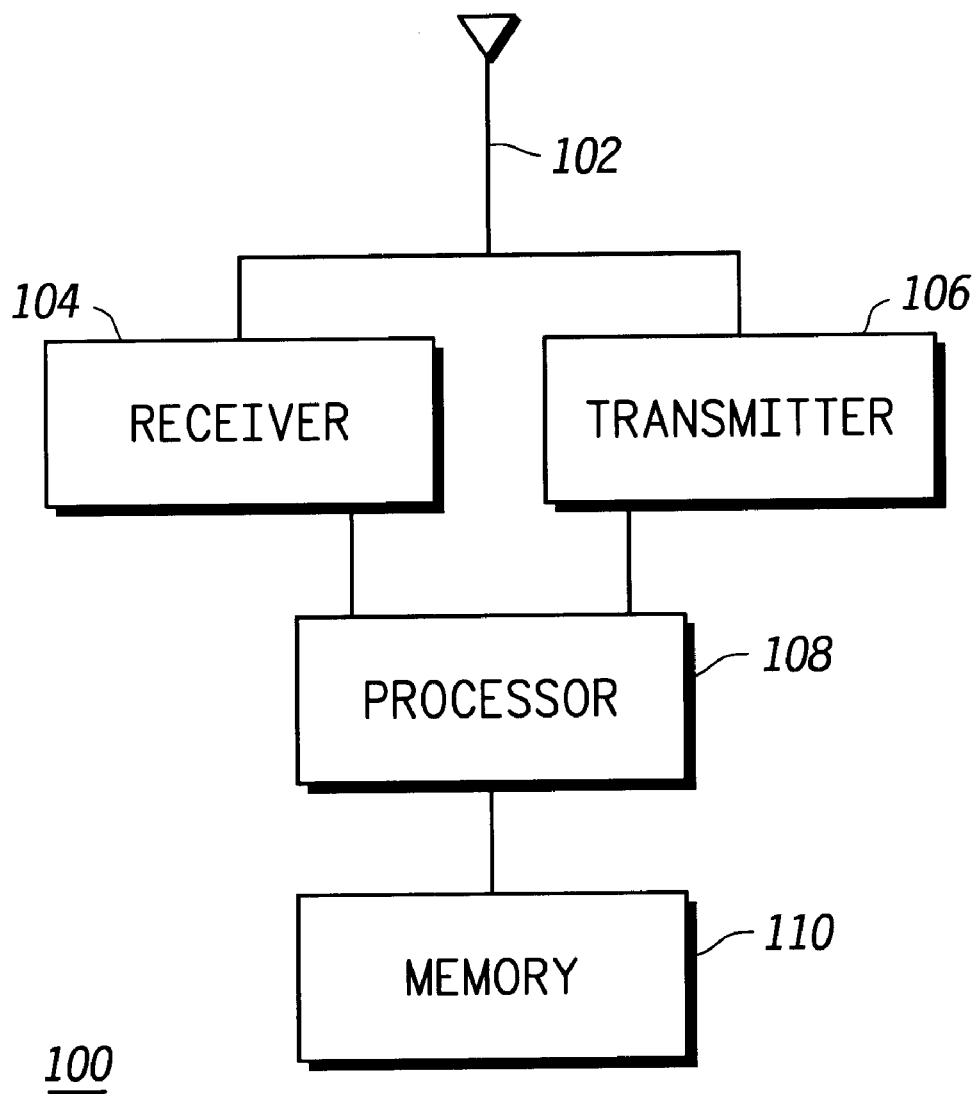
FIG. 1 is a block diagram of a communication device in accordance with the present invention.

To address the need for a method and apparatus that provides the higher efficiency and RF output power levels of a non-linear bias level combined with negative feedback correction and that meets the stringent off channel and error vector magnitude (EVM) requirements of cellular standards that do not allow for the initialization period required for a Cartesian feedback transmitter, a method and apparatus is provided for amplifying an input signal. The apparatus includes an amplifier feedback loop for amplifying an input signal at a power amplifier. The feedback loop is operated in an open loop mode when the power amplifier is operating at a first operating point and is operated in a closed loop mode when the power amplifier is operating at a second operating point. The apparatus further includes an auxiliary loop coupled to the amplifier feedback loop that provides phase training and power leveling for the feedback loop when the feedback loop is operating open loop, thereby allowing the transmitter to operate closed loop without causing significant off channel interference or introducing excessive distortion to the input signal during the feedback loop training period.

Generally, the present invention provides a linear transmitter that includes an amplifier feedback loop coupled to an auxiliary loop. The amplifier feedback loop includes a power amplifier that receives and amplifies an input signal to produce an output signal, wherein the power amplifier comprises an input port and an output port. The amplifier feedback loop further includes a feedback circuit coupled to the output port of the power amplifier that samples the output signal to produce a sampled output signal, and a plurality of switching devices that couple the feedback circuit to, and decouple the feedback circuit from, the input port of the power amplifier. The power amplifier operates at a first operating point when decoupled at the input port from the feedback circuit and operates at a second operating point when coupled at the input port to the feedback circuit, wherein the first operating point is different than the second operating point. When the power amplifier is decoupled at the input port from the feedback circuit, the auxiliary loop receives the sampled output signal from the feedback loop, compares the sampled output signal to a desired input signal, determines a phase error based on the comparison of the sampled output signal to the desired input signal, and aligns a phase of the sampled output signal with a phase of the input signal based on the phase error. In another embodiment, the present invention further encompasses an information source coupled to the amplifier feedback loop and a processor coupled to the amplifier feedback loop and to the auxiliary loop. The information source sources an input signal to the amplifier feedback loop, which input signal is amplified by the power amplifier to produce the output signal. The processor couples and decouples the feedback circuit to the power amplifier by controlling each switching device of the plurality of switching devices.

In yet another embodiment, the present invention encompasses a method for amplifying a radio frequency signal in a transmitter having a feedback loop that includes a forward path coupled to a feedback path, wherein the forward path includes a power amplifier. The method includes steps of receiving a first input signal and amplifying the first input signal while operating the power amplifier at a first operating point and with the feedback loop open to produce a first output signal. The method further includes steps of closing the feedback loop and adjusting the first operating point of the power amplifier to produce a second operating point, wherein the second operating point is different than the first operating point. The method further includes steps of receiving a second input signal and amplifying the second input signal while operating the power amplifier at the second operating point and with the feedback loop closed to produce a second output signal.

The present invention can be more fully understood with reference to FIGS. 1–7. FIG. 1 is a block diagram of a communication device 100 in accordance the present invention. Communication device 100 preferably comprises a Global System for Mobile Communications (GSM), or EDGE, radiotelephone commercially available from Motorola, Inc. of Schaumburg, Ill., with additional functionality so that the communication device is capable of performing all functions described below. Communication device 100 preferably includes a receiver 104 and a linear transmitter 106 that are each coupled to an antenna 102 and a processor 108, preferably a microprocessor. Processor 108 is further coupled to a memory 110 that stores programs and instructions executed by the processor.

Preferably, communication device 100 is operating in a time division multiple access (TDMA) communication system. In a TDMA system, a communication device involved in an active communication is allocated one or more time slots in which to transmit data. Each time slot is one of multiple time slots in a time frame. For example, in an EDGE system a time frame includes eight time slots. As a result, communication device 100, if allocated only one time slot of the multiple time slots in a time frame, can transmit data only during the one allocated time slot and cannot transmit during the intervening time slots. Those who are of ordinary skill in the art realize that the present invention is applicable to any TDMA system. The references herein to an EDGE system are provided merely to illustrate the principles of the present invention and are not intended to limit the present invention in any way.

When communication device 100 begins transmitting, new cellular systems such as EDGE require that the transmitted signal be highly linear without an initialization period. In the prior art, in order to meet the highly linear requirements of EDGE, a transmitter of a communication device must operate open loop at an output power level significantly below the compression point of the transmitter. However, operating open loop and at a significantly backed off power level, as opposed to utilizing a feedback loop and operating closer to a compression point, reduces communication device efficiency, which reduces the life of a limited life power source, such as a battery, in the communication device.

The invention provides for transmitter 106 to operate open loop and at a highly linear power amplifier bias level for the first time slot or slots of a transmission, which open loop high linearity mode meets the linearity and power output requirements of systems such as EDGE but does so with lower efficiency. Phase training and power level setting of a feedback loop in transmitter 106 occurs during the open loop period. After adjusting a phase and a power level set of the feedback loop, transmitter 106 transitions to closed loop operation. The transition may be gradual and continuous, wherein the loop is closed and a higher efficiency operating point is gradually attained over the course of multiple time slots, or the transition may be a singular transition, wherein a desired operating point is attained after the last open loop time slot and prior to or during the succeeding, closed loop time slot. During closed loop operation, transmitter 106 is operated closer to compression and at a higher efficiency than during open loop operation by lowering a power amplifier supply voltage, by changing a power amplifier load impedance, by adjusting a power amplifier bias level, or by doing a combination of the above. The result is transmitter 106 operation that meets the new cellular system linearity requirements and that benefits from the improved efficiency and EVM provided by operation at a higher efficiency, distortion producing operating point with feedback correction.

Figure 2:
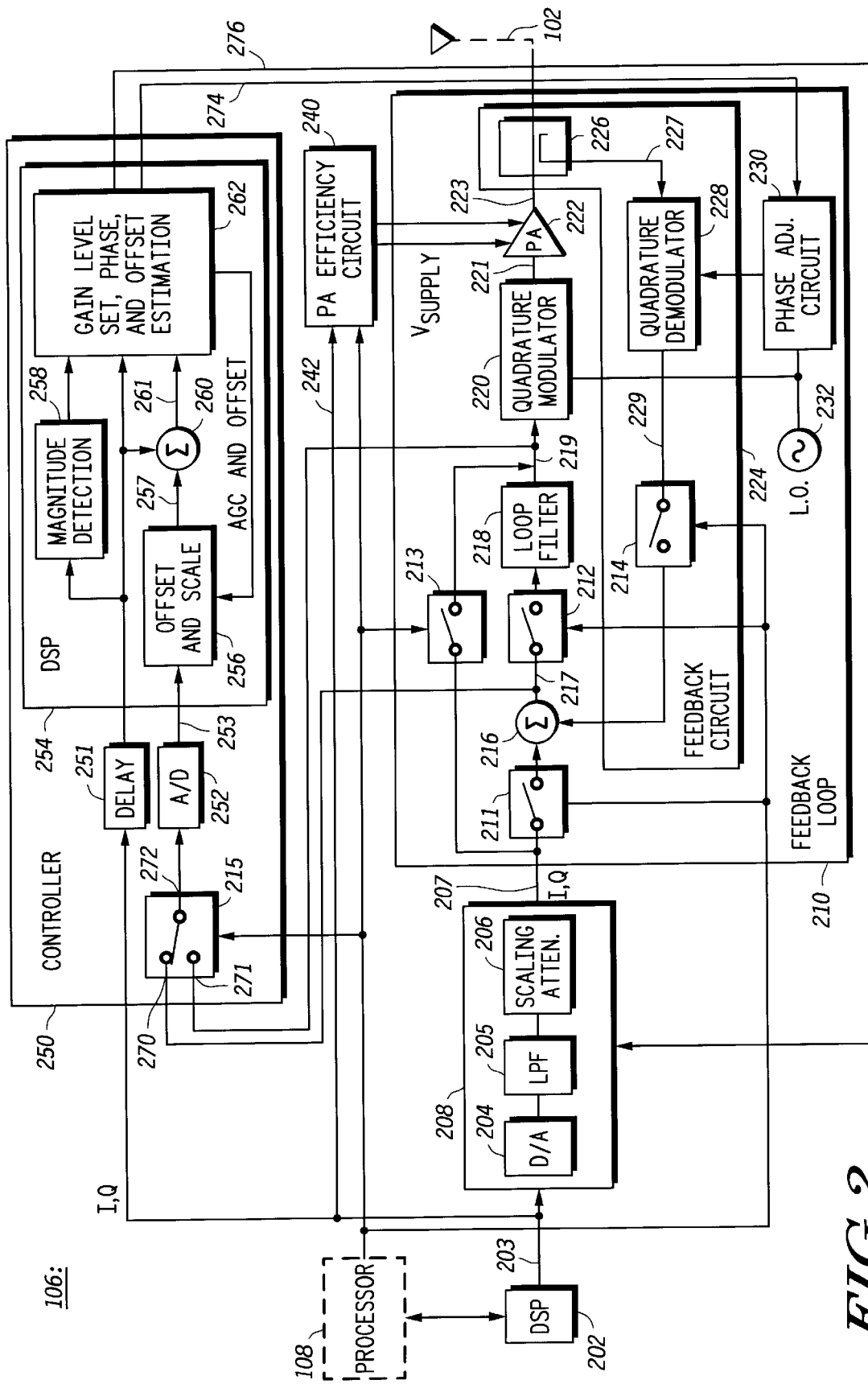
FIG. 2 is a block diagram of a linear transmitter of FIG. 1 in accordance with the present invention.

FIG. 2 is a block diagram of a linear transmitter 106 in accordance with the present invention. Linear transmitter 106 preferably includes a digital signal processor (DSP) 202, which DSP 202 is coupled to processor 108 and includes or is coupled to associated memory. DSP 202 is further coupled to an input converter block 208 that includes a digital-to-analog converter (D/A) 204 coupled to a low pass filter (LPF) 205, which LPF 205 is coupled to a scaling attenuator 206. Linear transmitter 106 further includes an amplifier feedback loop 210 coupled to input converter block 208, a Power Amplifier (PA) efficiency circuit 240 coupled to DSP 202 and to feedback loop 210, and a data driven training controller 250 coupled to DSP 202, to input converter block 208, and to feedback loop 210.

Amplifier feedback loop 210 preferably is a Cartesian feedback loop that includes multiple switching devices 211–214 that open and close the feedback loop and route a feedback signal to controller 250 during open loop operation. Although one switching device topology and algorithm for opening and closing switching devices 211–214 is described below, those who are of ordinary skill in the art realize that there are many switching device topologies and switching device controlling algorithms that may be used in the invention without departing from the spirit and scope of the present invention. The switching device topology and algorithm described herein is meant to provide an illustration of the principles of the present invention and is not intended to limit the present invention in any way.

Each switching device 211–214 preferably includes an amplifier; however, those of ordinary skill in the art realize that switching devices 211–214 may include any kind of device that may be opened or closed, or disabled and enabled, by a control signal received from processor 108, such as a field effect transistor (FET) or a bipolar junction transistor (BJT). Each switching device 211–214 is controlled by a control signal produced by processor 108.

Feedback loop 110 further includes a summing junction 216 coupled to each of switching devices 211 and 212, a loop filter 218 coupled to each of switching devices 212 and 213, and a quadrature modulator 220 coupled to loop filter 218, to switching device 213, and to a Power Amplifier (PA) 222. When feedback loop 210 is operating open loop, switching device 213, quadrature modulator 220, and PA 222 together constitute a feedback loop 210 forward path for an input signal sourced by DSP 202. When feedback loop 210 is operating closed loop, switching devices 211 and 212, summing junction 216, and loop filter 218 replace switching device 213 in the forward path.

Figure 3:
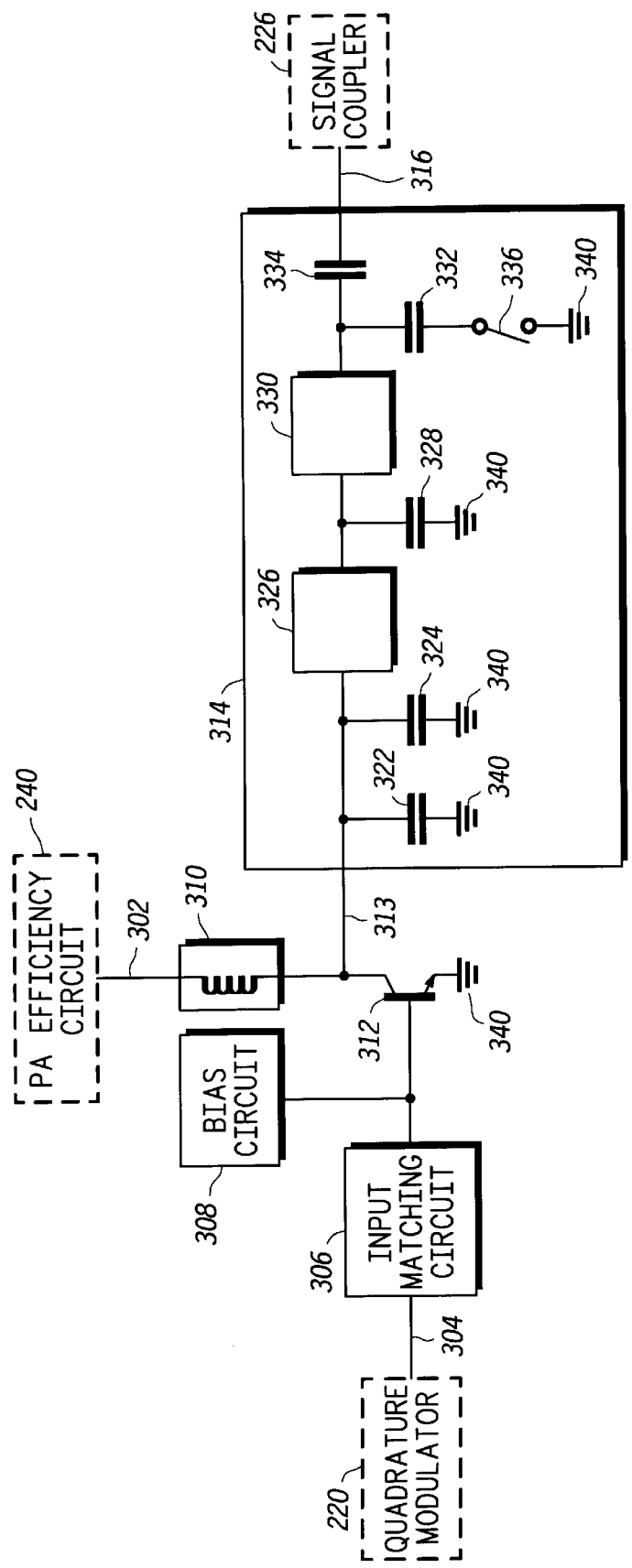
FIG. 3 is a block diagram of a power amplifier of FIG. 2 in accordance with the present invention.

As shown in FIG. 3, PA 222 preferably includes multiple input ports 302, 304 (two shown) for receiving input signals and an output port 316 that produces output signals. An input port 302 of multiple input ports 302, 304, preferably a supply port, is coupled to PA efficiency circuit 240. Another input port 304 of multiple input ports 302, 304 is coupled to a quadrature modulator 220. Output port 316 produces amplified versions of an input, or drive, signal received by PA 222 from quadrature modulator 220. PA 222 further includes a radio frequency (RF) amplifying element 312 such as a power transistor, an input matching circuit 306, an output matching circuit 314, and biasing and decoupling circuitry 308, 310 as are necessary to allow the functionality of RF amplifying element 312 and to bias the RF amplifying element class A, AB, or a non-linear bias such as class B.

Preferably, output matching circuit 314 includes multiple capacitances 322, 324 coupled between an output 313 of RF amplifying element 312 and ground 340. Output matching circuit 314 further includes a complex impedance 326. A first side of complex impedance 326 is coupled to output 313, and a second side of complex impedance 326 is coupled to a first side of complex impedance 330 and to a shunt capacitance 328 that is further coupled to ground 340. A second side of complex impedance 330 is coupled to a capacitance 332 and is further coupled to a blocking capacitance 334. Capacitance 332 is shunted to ground 340 via an RF switching device 336, such as a PIN diode or a GASFET switch, that is closed or opened, or enabled or disabled, by a mode-of-operation signal received by PA 222 from PA efficiency circuit 240. By enabling and disabling switching device 336, processor 108 is able to include and remove capacitance 332 from the load presented to RF amplifying element 312, thereby adjusting the load presented to the RF amplifying element and varying the operating point of RF amplifying element 312 and of PA 222. By proper selection of values of components 322–334, a designer of transmitter 106 can effectuate a highly linear operating point of RF amplifying element 312 when switching device 336 is closed and a less linear but higher efficiency operating point when switching device 336 is open. An example of an adjustable load circuit, such as output matching network 314, whose load impedance may be adjusted in response to a mode-of-operation signal is described in detail in U.S. Pat. No. 5,060,294, entitled "Dual Mode Power Amplifier for Radiotelephone," which patent is assigned to the assignee of the present invention and is hereby incorporated herein in its entirety. Those who are of ordinary skill in the art realize that many different topologies may be used for output matching network 314 and that the topology described herein is presented merely for the purpose of illustrating the principles of the present invention.

Feedback loop 210 further includes a feedback circuit, or path, 224 that is coupled to the output port of PA 222 and to summing junction 216. Feedback circuit 224 includes a signal coupler 226, preferably a directional coupler, that is coupled to the output port of PA 222, a quadrature demodulator 228 that is coupled to signal coupler 226 and to phase adjustment circuit 230, and switching device 214 that is coupled to quadrature demodulator 228 and to summing junction 216.

PA efficiency circuit 240 preferably includes a switching power supply. The switching power supply generates a supply voltage and a supply current that is sourced to, and serves as the direct current (DC) feed for, the RF amplifier element via the supply port of PA 222. Switching power supplies are well known in the art and are known to include or be coupled to a power source, such as a battery, and to further include a control circuit and a switching element that are used to regulate output supply voltages.

The control circuit of the switching power supply modulates the amplitude of the supply voltage by adjusting a duty cycle of the switching element. In the invention, the supply voltage is adjusted based on switching device 211–214 control signals received by PA efficiency circuit 240 from processor 108. That is, processor 108 controls the enabling and disabling of switching devices 211–214 by conveying a control signal to each switching device. The control signal transmitted to each switching device varies based upon whether transmitter 106 is operating open loop or closed loop. Each switching device 211–214 control signal is conveyed to PA efficiency circuit 240 as well as to the individual switching device 211–214, and PA efficiency circuit 240 is thereby able to determine whether transmitter 106 is operating open loop or closed loop and to adjust the PA 222 supply voltage and/or load impedance accordingly.

Controller 250 establishes an auxiliary loop to feedback loop 210. Controller 250 includes a switching device 215 that includes multiple input ports 270, 271 and one output port 272. Preferably, switching device 215 is a multiplexer with multiple input ports and an output port; however, those of ordinary skill in the art realize that many types of switching devices may be used here where a coupling of one of multiple input ports to an output port is controlled by one or more control signals. The coupling of each input port 270, 271 of switching device 215 to output port 272 is controlled by one or more control signals received from processor 108.

Controller 250 further includes an analog-to-digital converter (A/D) 252 coupled to switching device 215 and a DSP 254 coupled to A/D 252 and to a delay module 251. Preferably, DSP 254 is the same DSP as DSP 202; however, in an alternative embodiment, DSP 254 may be different than DSP 202 and A/D 252 is coupled to both DSP's. DSP 254 includes an associated memory that stores data and programs that are executed by the DSP. DSP 254 further includes multiple signal processing software modules 256–262, including a magnitude detection module 258 and an offset and scale module 256 that are each in communication with a summing junction module 260, and a gain level set, phase, and offset estimation module (adapter module) 262 in communication each of offset and scale module 256, magnitude detection module 258, and summing junction module 260.

The operation of transmitter 106 is as follows in accordance with the present invention. Feedback loop 210 is operated open loop for at least one time slot. During open loop operation, transmitter 106 phase trains and power levels feedback loop 210. Furthermore, during open loop operation, RF amplifying element 312 of PA 222 is operated at a high linearity/low efficiency operating point that is significantly backed off from the gain compression point of the RF amplifying element and couples a minimal amount of power into off channels. For example, the supply voltage provided by PA efficiency circuit 240 to PA 222 can be of a magnitude large enough, and/or the output impedance of the RF amplifying element in PA 222 can present an output match of sufficiently high linearity, that RF amplifying element 312 has ample headroom when amplifying drive signal 221 and does not near gain compression.

Gain compression produces distortion in a signal being amplified, which diminishes linearity and produces splatter into off channels. When operating open loop, class A bias and an increased supply voltage magnitude (as opposed to a reduced magnitude supply voltage when operating closed loop) are necessary since feedback circuit 224 is decoupled from an input signal forward path and cannot compensate for distortion introduced to the input signal during amplification by PA 222. However, biasing the RF amplifying element class A as opposed to class AB or class B, providing PA 222 a supply voltage of greater magnitude during open loop operation than during closed loop operation, and/or providing a higher linearity output matching circuit during open loop, as opposed to closed loop, operation, results in open loop operation that is at a lower efficiency than closed loop operation. A result of operating at a lower efficiency is a reduced life for a limited life power source, such as a battery, in PA efficiency circuit 240 and potential thermal issues.

The operation of linear transmitter 106 when operating in open loop mode is as follows. DSP 202 serves as an input signal source. DSP 202 generates a complex digital baseband input signal 203 having quadrature components, that is, an in-phase (I) component and a quadrature (Q) component. Input signal 203 is sourced to controller 250 and to input converter block 208. D/A 204 of input converter block 208 converts each of the in-phase and quadrature components of input signal 203 from a digital signal to an analog signal, and filter 205 filters the converted input signal. Based on a control signal received from controller 250, scaling attenuator 206 of input converter block 208 magnitude scales each of the in-phase and quadrature components of input signal 203 to a level that will produce an output signal of a desired power level when the input signal is amplified by PA 222. As a result, input converter block produces a scaled, analog input signal 207 that includes an in-phase and a quadrature component. Scaled, analog input signal 207 is then conveyed by input converter block 208 to feedback loop 210.

During the open loop period, switching devices 211 and 212 are open and switching devices 213 and 214 are closed. As a result, input signal 207 received by feedback loop 210 is routed to quadrature modulator 220 via switching device 213. In addition to receiving input signal 207, quadrature modulator 220 receives a reference signal from a reference signal source 232, preferably a local oscillator 232. Preferably, the reference signal is at a desired frequency of a PA 222 output signal 223; however those who are of ordinary skill in the art realize that there are many methods of upconverting input signal 207 to a desired frequency of output signal 223, such as first upconverting signal 207 to an intermediate frequency (IF) and then upconverting from the IF to a desired frequency of output signal 223, which methods may utilize multiple reference signals, that may be used herein without departing from the spirit and scope of the present invention. Quadrature modulator 220 multiplies each component of scaled, analog input signal 207 with the reference signal to produce an upconverted in-phase component and an upconverted quadrature component of input signal 207. Quadrature modulator 220 then combines the upconverted in-phase and quadrature components to produce an RF drive signal 221. RF drive signal 221 is conveyed by quadrature modulator 220 to PA 222, where drive signal 221 is amplified by the RF amplifying element of PA 222 to produce an output signal 223. Output signal 223 is then transmitted via antenna 102 to produce a transmit signal.

A sample of output signal 223 is fed back to summing junction 216 via signal coupler 226 and quadrature demodulator 228. Signal coupler 226 samples output signal 223 to produce a sampled output signal 227, and conveys sampled output signal 227 to quadrature demodulator 228. Quadrature demodulator 228 produces a baseband output signal 229 by splitting sampled output signal 227 into an in-phase (I) component and a quadrature (Q) component and multiplying each component with a reference signal to produce a baseband in-phase component and a baseband quadrature component. The reference signal is sourced to quadrature demodulator 228 by local oscillator 232 via a phase adjustment circuit 230 and is preferably at a desired frequency of output signal 223.

Baseband output signal 229, which includes a baseband in-phase component and a baseband quadrature component, is then conveyed by quadrature demodulator 228 to summing junction 216 via switching device 214. Since switching devices 211 and 212 are each open, the baseband output signal received by summing junction 216 is not combined with an input signal in the summing junction. Summing junction 216 then conveys baseband output signal 229 to controller 250.

When feedback loop 210 is operating open loop, controller 250 performs phase training, power leveling, and direct current (DC) offset estimation functions. Phase training is performed by controller 250 in order to match a phase of a feedback signal routed through feedback circuit 224 with a phase of the forward path input signal. Power leveling is performed by controller 250 in order to maintain a desired output power level of transmitter 106. DC offset estimation by controller 250 includes a determination by controller 250 of the DC offset of the sampled output signal routed to controller 250, which offset must be corrected in order to properly compare sampled output signal with a desired input signal. When feedback loop 210 is closed, transmitter 106 need no longer operate significantly below the compression point since the feedback loop is able to correct for distortions introduced to a drive signal when the drive signal is amplified by PA 222. As a result, during closed loop operation the supply voltage supplied by PA efficiency circuit 240 to PA 222 may be reduced while the output power level is maintained, thereby improving transmitter 106 efficiency without detrimentally impacting transmitter 106 linearity.

During open loop operation, controller 250 receives baseband output signal 229 via input port 270 of switching device 215, which input port is enabled by processor 108. Switching device 215 conveys baseband output signal 229 to A/D 252. A/D 252 digitizes each of the in-phase and quadrature components of baseband output signal 229 to produce a digital baseband output signal 253. A/D 252 then conveys signal 253 to DSP 254.

DSP 254 adjusts a phase setting and a power level of feedback loop 210 during open loop operation based on a comparison of digital baseband output signal 253 and a phase delayed version of complex digital baseband input signal 203. Power leveling is performed by controller 250 in accordance with a process described in U.S. Pat. No. 5,278, 994, entitled "Power Amplifier Saturation and Detection and Correction Method and Apparatus," which patent is assigned to the assignee of the present invention and is hereby incorporated herein in its entirety.

Phase setting preferably includes adjustment of a phase setting of feedback circuit 224; however, in an alternative embodiment, DSP 254 may adjust a phase setting of the forward path of feedback loop 210. Controller 250 routes input signal 203 to DSP 254 via delay module 251. Delay module 251 applies a time delay to input signal 203 in order to compensate for delay introduced principally by input converter block 208, A/D 252, and offset and scale module 256. Although delay module 251 would typically be implemented outside of DSP 254, those skilled in the art would recognize that if the clock speed of DSP 254 is sufficient, the delay module could be implemented inside DSP 254. The time delayed version of input signal 203 is then conveyed by delay module 251 to DSP module 254, which in turn routes the signal to each of magnitude detection module 258, summing junction module 260, and adapter module 262. The time delay introduced into signal 203 provides for the time synchronization, at summing junction 260, of signal 203 with a signal 257 output by offset and scale module 256. The time delay further provides for the time synchronization at adapter module 262 of an error signal 261 output by summing junction 260 with a signal output by magnitude detector 258. DSP 254 also routes digital baseband output signal 253 to offset and scale module 256.

Offset and scale module 256 provides linear gain control and DC offset compensation for the auxiliary loop. Under the direction of adapter module 262, offset and scale module 256 scales a magnitude of each of the in-phase and quadrature components of digital baseband output signal 253 based on a magnitude of the complex digital baseband input signal 203. Preferably, the magnitude of each of the in-phase and quadrature components of signal 253 is normalized by multiplying the magnitude of each component by a scaling factor. The scaling factor is based on the magnitude of input signal 203, which magnitude is detected by magnitude detection module 258 and conveyed by module 258 to adapter module 262. Offset and scale module 256 also adjusts the DC offset of the in-phase and quadrature components of baseband output signal 253 by adding a scalar to each component so that, if the DC offset adjusted components are represented as vectors in a complex (I/Q) plane, the vectors will be centered at the origin of the plane. The process by which offset and scale module 256 scales and offsets the components of digital baseband output signal 253 under the direction of adapter module 262 is described in detail in U.S. Pat. No. 5,675,287, entitled "Digital DC Correction Circuit for a Linear Transmitter," which patent is assigned to the assignee of the present invention and is hereby incorporated herein in its entirety. By normalizing and adjusting the DC offset of the in-phase and quadrature components of baseband output signal 253, offset and scale module 256 facilitates a comparison of baseband output signal 253 to baseband input signal 203 at summing junction 260.

Offset and scale module 256 conveys the normalized and DC offset adjusted version of baseband output signal 253 to summing junction 260. At summing junction 260, the normalized and DC offset adjusted version of signal 253 is summed with the time delayed version of baseband input signal 203 to produce an error signal 261. Summing junction 260 conveys error signal 261 to adapter module 262. Adapter module 262 produces multiple control signals 274, 276, preferably a phase control signal 274 and a magnitude control signal 276, based on error signal 261. Magnitude control signal 276 is fed back to scaling attenuator 206 and controls an adjustment of a magnitude of input signal 203, and thereby a magnitude of drive signal 221, to avoid overdriving PA 222. Phase control signal 274 is fed back to phase adjustment circuit 230 in feedback loop 210 and controls a phase setting of feedback circuit 224, and thereby of the fed back sampled output signal 227, by controlling a phase of the reference signal sourced to quadrature demodulator 228 via phase adjustment circuit 230. In an alternative embodiment, phase adjustment circuit 230 may be coupled between local oscillator 232 and quadrature modulator 220 and control signal 274 may control the phase setting of the forward path of input signal 203. Examples of a process for generating control signals 274 and 276 by controller 250 are described in U.S. Pat. No. 5,675,286, entitled "Method and Apparatus for an Improved Linear Transmitter," which patent is assigned to the assignee of the present invention and is hereby incorporated herein in its entirety.

Figure 4:
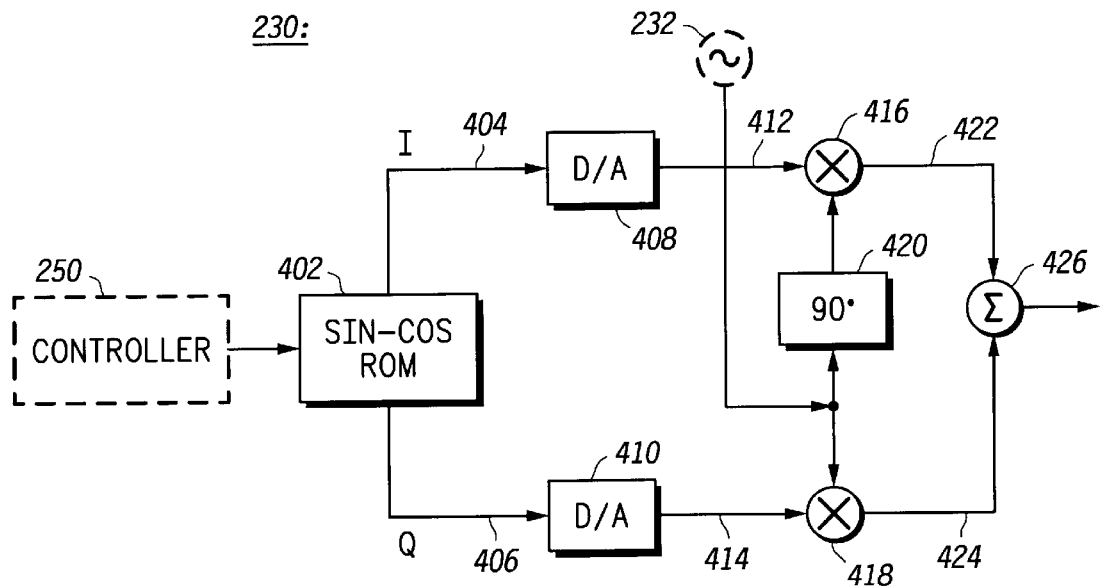
FIG. 4 is a block diagram of a phase adjustment circuit of FIG. 2 in accordance with the present invention.

FIG. 4 is a block diagram of phase adjustment circuit 230 in accordance with a preferred embodiment of the present invention. As shown in FIG. 4, phase adjustment circuit 230 includes a sine-cosine ROM 402 that receives control signal 274, preferably an 8-bit word, from controller 250 and produces a digital baseband in-phase signal 404 and a digital baseband quadrature signal 406 based on the 8-bit word. Each digital baseband signal 404, 406 is conveyed to a respective digital-to-analog converter (D/A) 408, 410 that is coupled to ROM 402. D/A's 408, 410 respectively convert each of digital baseband signals 404, 406 to a respective analog signal 412, 414, and respectively convey each analog signal 412, 414 to a respective mixer 416, 418. In addition to receiving one of analog signals 412, 414, each mixer 416, 418 further receives a reference signal, preferably at a desired frequency of output signal 223, from local oscillator 232. Mixer 416 receives the reference signal via a phase shifting circuit 420 coupled between the mixer and local oscillator 232. Phase shifting circuit 420 introduces a phase shift of approximately 90° to the reference signal provided to mixer 416 relative to the reference signal provided to mixer 418. Each mixer 416, 418 multiplies the respectively received analog signal 412, 414 with the respectively received reference signal to produce a respective upconverted signal 422, 424. Each mixer 416, 418 then conveys its respective upconverted signal 422, 424 to a signal combiner 426, where upconverted signals 422, 424 are combined to produce a phase adjusted reference signal. The phase adjusted reference signal is then conveyed to quadrature demodulator 228 and is used to adjust the phase of sampled output signal 227 that is fed back to summing junction 216.

In one embodiment of the present invention, adapter 262 adjusts the phase of the reference signal provided by local oscillator 232, and thereby the phase of fed back sampled output signal 227, by using a successive approximation routine (SAR). A negative feedback system requires that a feedback signal be aligned approximately 180° out-of-phase with a feedforward signal, that is, that a 180° phase difference exist between baseband output signal 229 and a derivative of input signal 203 (i.e., scaled, analog input signal 207) when each signal is received by summing junction 216. By operating open loop for two time slots, transmitter 106 is permitted a gross adjustment and a fine adjustment of a phase of the reference signal sourced by local oscillator 232 to quadrature demodulator 228 via phase adjustment circuit 230, and thereby of a phase of the fed back sampled output signal 227.

In order to align the phase of the feedback signal with the phase of the feedforward signal, the time delay introduced to a signal by a signal path from DSP 202 to summing junction 260 via input converter block 208, switching device 211, summing junction 216, switching device 215, A/D 252, and offset and scale module 256 (with switching devices 212, 213, and 214 disabled) is determined by DSP 254 during factory testing, on power up of transmitter 106, or between active time slots, and is stored in delay module 251. Delay module 251 then applies the determined time delay to the input signal 203 coupled to controller 250 in order to properly align the time delayed version of signal 203 with offset and scaled signal 257, and to properly align error signal 261 with the signal output by magnitude detector 258.

In another embodiment of the present invention, adapter 262 incrementally adjusts the phase of the reference signal provided by local oscillator 232, and thereby the phase of fed back sampled output signal 227, in multiple equal-sized steps. The number of steps required to align the phase of the feedback signal with the phase of the feedforward signal, and concomitantly the number of time slots during which transmitter 106 runs open loop, depends on a size of each step and a size of an initial phase disparity between the feedback and feedforward signals.

In yet another embodiment of the present invention, transmitter 106 operates open loop for only one time slot. When operating open loop for only one time slot, DSP 254 determines a phase of each of complex digital baseband input signal 203 and digital baseband sampled output signal 253 by executing an arctangent function that is stored in the memory associated with the DSP. DSP 254 then compares the two determined phases, determines a phase difference based on the comparison, and produces an 8-bit control signal 274 that is based on the determined difference, instead of based on error signal 261, and that is designed to produce an approximately 180° phase difference between the derivatives of fed back sampled output signal 227 (i.e., baseband output signal 229) and of input signal 203 received by summing junction 216. Use of the arctangent function allows DSP 254 to precisely determine a phase difference and make a single, rather than an incremental, adjustment in the phase of the fed back signal. However, computation of the arctangent function requires substantial processing resources of DSP 254, which may not always be available.

In general, transmitter 106 operates open loop for one or more, preferably two, time slots, during which time slots controller 250 adjusts the phase of feedback circuit 224 by changing the phase of a reference signal that is fed to quadrature demodulator 228. When transmitter 106 is running open loop, PA 222 is operating at a low efficiency highly linear bias level that is well below the PA gain compression point in order to minimize off channel interference and to meet the EVM requirements of the new cellular standards such as EDGE. When the phase of feedback circuit 224 is properly set, that is, when a phase of a demodulated version of fed back sampled output signal 227 (i.e., baseband output signal 229) is set to be approximately 180° out-of-phase with a phase of input signal 207 as received at summing junction 216, then feedback loop 210 is closed and the PA is operated closer to compression and at a higher efficiency.

Preferably, feedback loop 210 is closed after the last open loop time slot and prior to the next succeeding time slot assigned to transmitter 106, such as between the second and third assigned time slots if communication device 100 is assigned only one time slot per time frame. During closed loop operation, switching devices 211, 212, and 214 are closed and switching device 213 is opened. Similar to open loop operation, during closed loop operation DSP 202 sources a complex digital baseband input signal 203 that includes an in-phase component and a quadrature component to input converter block 208 and to controller 250. Input converter block 208 converts input signal 203 to an analog signal, filters the converted input signal, and magnitude scales the converted input signal in response to a control signal received from controller 250 to produce a scaled, analog input signal 207 that includes scaled, analog in-phase and quadrature components. Scaled, analog input signal 207 is then conveyed by input converter block 208 to feedback loop 210. However, during closed loop operation, input signal 203 is no longer scaled to avoid driving PA 222 into gain compression but is instead scaled to drive an optimum amount of gain compression that just meets off channel interference requirements and therefore provides optimal efficiency or a desired combination of efficiency and splatter. Scaled, analog input signal 207 is then routed to summing junction 216 via switching device 211, which summing junction is bypassed in the forward path during open loop operation.

Similar to open loop operation, during closed loop operation a sample of output signal 223 is fed back to summing junction 216 via signal coupler 226 and quadrature demodulator 228. Signal coupler 226 samples the output signal to produce a sampled output signal 227 and conveys the sampled output signal to quadrature demodulator 228. Quadrature demodulator 228 then produces a baseband sampled output signal 229 that includes a baseband in-phase component and a baseband quadrature component as described above. However, during closed loop operation, the phase of the reference signal sourced to quadrature demodulator 228 by local oscillator 232 via phase adjustment circuit 230 has been adjusted (i.e., during open loop operation) such that a phase of the baseband sampled output signal 229 conveyed to summing junction 216 is approximately 180° out-of-phase with a phase of an input signal 207 received by the summing junction.

Summing junction 216 combines the scaled, analog components of input signal 207 with the baseband sampled output signal 229 fed back by feedback path 214 to produce a forward path error signal 217 that includes an in-phase and a quadrature component. Summing junction 216 conveys error signal 217 to loop filter 218 via switching device 212, where error signal 217 is filtered to produce a filtered error signal 219 that includes an in-phase and a quadrature component. Filtered error signal 219 is conveyed to quadrature modulator 220, where each of the in-phase and quadrature components of the filtered error signal are upconverted to a desired frequency of an output signal 223 and combined to produce an RF drive signal 221. RF drive signal 221 is then conveyed to PA 222, where the drive signal is amplified to produce output signal 223 that is transmitted via antenna 102.

During closed loop operation, filtered error signal 219 is also coupled to controller 250 via input port 271 of switching device 215, which input port is enabled by processor 108. Controller 250 routes filtered error signal 219 to A/D 252, which digitizes the filtered error signal to produce a digital filtered error signal 253 and routes the digital filtered error signal to DSP 254. DSP 254 also receives complex digital baseband input signal 203 sourced by DSP 202. DSP 254 then compares input signal 203 to digital filtered error signal 253 and estimates and performs phase adjustments, gain level setting, and DC offset correction in accordance with the techniques described with respect to the isolator elimination circuit in the above-referenced U.S. Pat. No. 5,675,287.

Preferably, during the first time slot after closing feedback loop 210, DSP 202 will begin changing a PA bias ramp 242 applied by the DSP to PA efficiency circuit 240. PA bias ramp 242 controls the supply voltage sourced by PA efficiency circuit 240 to PA 222. When transmitter 106 is operating open loop, bias ramp 242 causes PA efficiency circuit 240 to source a supply voltage and current of sufficient magnitude to allow RF amplifying element 312 to operate class A and to amplify drive signal 221 to a desired output power level with significant gain compression margin. When transmitter 106 switches to closed loop operation, DSP 202 adjusts bias ramp 242 to cause PA efficiency circuit 240 to source a reduced magnitude supply voltage that results in PA 222 operating at a reduced quiescent current and RF amplifying element 312 operating closer to the RF amplifying element's compression point while maintaining the same output power level as during open loop operation. Changes in PA 222 quiescent current causes gain, phase, and non-linear operating point changes in PA 222, which changes are all estimated and compensated for by controller 250 and, via control signals generated by controller 250, scaling attenuator 206 and phase adjustment circuit 230. DSP 202 also controls the rate of change in the quiescent current sourced by PA efficiency circuit 240 to PA 222 so that the input signal phase and gain changes and the non-linearities resulting from the changes in current are incremental and manageable by controller 250.

In an alternative embodiment, PA efficiency circuit 240 also provides a bias voltage and current to PA 222 that are used to determine the bias level of RF amplifying element 312. The level of bias voltage and current provided by PA efficiency circuit 240 to PA 222 are controlled by a second PA bias ramp sourced by DSP 202 to PA efficiency circuit 240. When transmitter 106 switches to closed loop operation, instead of or in addition to adjusting the supply voltage, DSP 202 adjusts the second bias ramp to cause PA efficiency circuit 240 to source a bias voltage and current sufficient to bias the RF amplifying element class AB or a non-linear bias such as class B or class C, which biases correspond to a lower PA 222 quiescent current and a higher PA 222 efficiency than a highly linear bias such as class A.

In another alternative embodiment of the present invention, during the first time slot after closing feedback loop 210, DSP 202 adjusts a load (e.g., output matching circuit 314) of PA 222. The load adjustment can either be in addition to, or instead of, the change in the supply voltage and current and/or the change in bias voltage and current described above. In one embodiment, adjustable load circuit 314 of RF amplifying element 312 in PA 222 is adjusted in response to a method-of-operation signal generated by PA efficiency circuit 240. PA efficiency circuit 240 receives switching device 211–214 control signals from DSP 202, and based on the received control signals is able to determine whether transmitter 106 is operating open loop or closed loop. PA efficiency circuit 240 then generates a method-of-operation signal based on the control signals, which method-of-operation signal enables switching device 336 in output matching circuit 314 when transmitter 106 is operating open loop and disables switching device 336 when transmitter 106 is operating closed loop.

Figure 5:
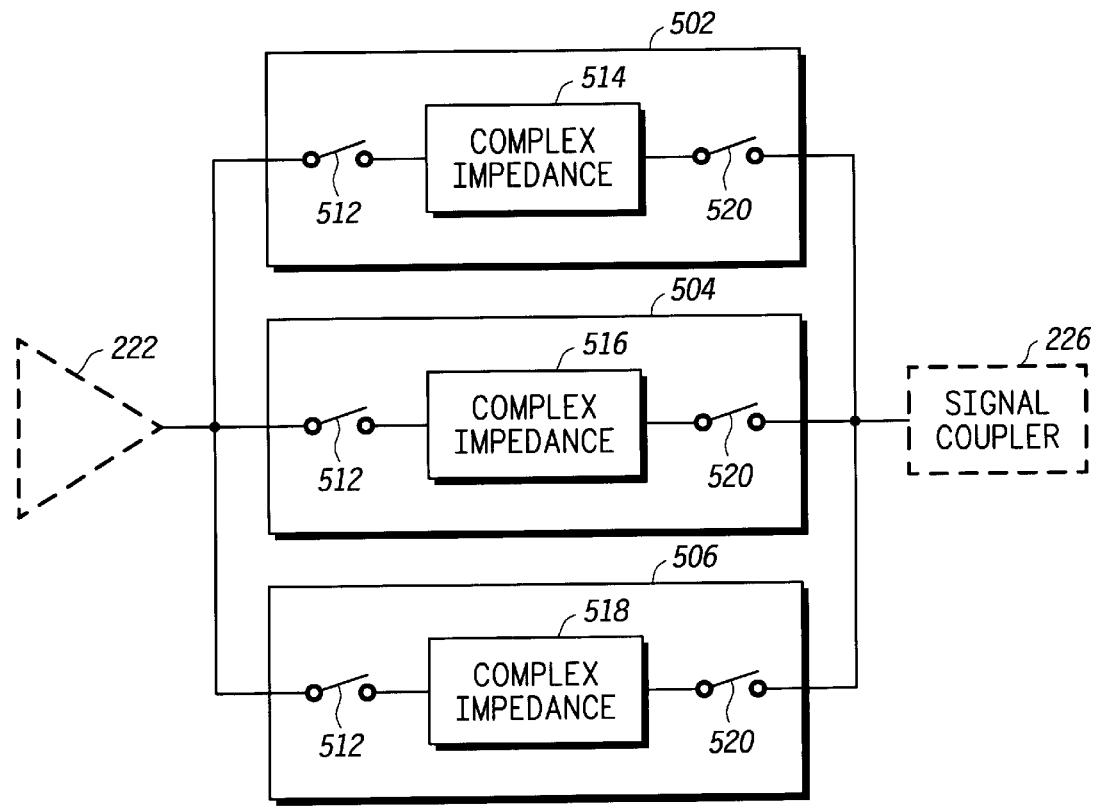
FIG. 5 is a block diagram of multiple power amplifier load circuits in accordance with the present invention.

In a second embodiment, as shown in FIG. 5, output matching circuit 314 of the RF amplifying element is not adjustable and linear transmitter 106 further includes multiple PA load circuits 502–506 (three shown) that are each coupled between the output port of PA 222 and signal coupler 226. As shown in FIG. 5, each PA load circuit of the multiple PA load circuits 502–506 includes an input RF switching device 512, such as a PIN diode or a GASFET switch, coupled to the PA 222 output port and an output RF switching device 520 coupled to signal coupler 226. Coupled between each input and output RF switching device 512, 520 is a complex impedance circuit 514–518. Alternatively, instead of being coupled between PA 222 output port and signal coupler 226, each of the multiple power amplifier load circuits 502–506 may be coupled between signal coupler 226 and antenna 102, or may be included in PA 222 and coupled between the RF amplifying element 312 in PA 222 and the output port of PA 222 in lieu of output matching circuit 314.

The input and output RF switching devices 512, 520 in each of the multiple power amplifier load circuits 502–506 are coupled to PA efficiency circuit 240 and are enabled and disabled by the above described method-of-operation signals generated by the PA efficiency circuit. By enabling the input and output RF switching devices 512, 520 in a power amplifier load circuit 502–506, PA efficiency circuit 240 couples the power amplifier load circuit into an output path of a signal amplified by PA 222. By coupling different power amplifier load circuits 502–506 into the output path of the amplified signal, PA efficiency circuit 240 is able to adjust a load presented to PA 222 and thereby adjust an operating point, and an efficiency, of PA 222.

Changing output paths during a transmission of a signal amplified by PA 222 can cause discontinuities in the phase estimation performed by controller 250 unless each path has the same delay. To avoid such discontinuities and their potential for causing transmitter 106 instability, the invention enables and disables the RF switching devices of each power amplifier load circuit only during non-transmission time periods (i.e., between transmission time slots) for transmitter 106. Furthermore, the invention uses appriori estimates of the approximate phase delay of each power amplifier load circuit 502–506 to allow controller 250 to make adjustments in phase adjustment circuit 230, and thereby in the phase of fed back sampled output signal 227, during the non-transmission time periods that approximately compensate for the changes in forward path delay resulting from a change of PA 222 output paths. Once the approximate phase is set, the closed loop phase adjustment process provided by controller 250 causes the phase of the fed back signal 227, via phase adjustment circuit 230, to converge to an optimal phase during the next transmission time slot.

Figure 6:
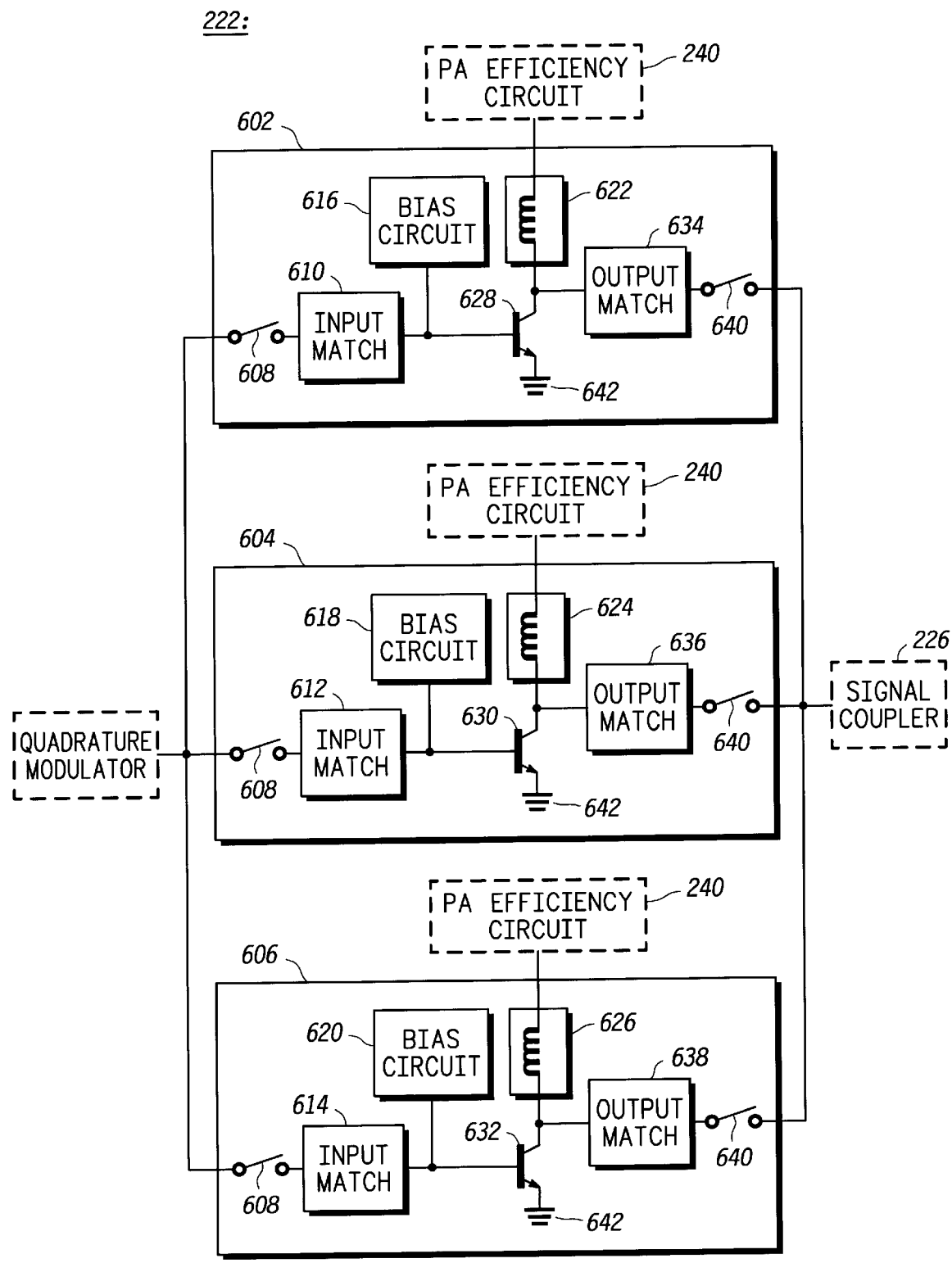
FIG. 6 is a block diagram of a power amplifier of FIG. 2 in accordance with the present invention.

In yet another alternative embodiment of the present invention, as shown in FIG. 6, PA 222 includes multiple, parallel RF amplification "stages" 602–606 (three shown). Each RF amplification stage 602–606 includes an RF amplifying element 628–632, such as power transistor such as a BJT or a FET, coupled at a base or a gate to an input matching circuit 610–614, at a collector or a drain to an output matching circuit 634–638, and at an emitter or a source to a circuit ground 642. Each RF amplification stage 602–606 further includes such biasing and decoupling circuitry 616–626 as are necessary to allow the functionality of the RF amplifying element 628–632 and to operate the RF amplifying element at a predetermined bias level. Preferably, each RF amplification stage of the multiple RF amplification stages 602–606 is designed to operate at a different operating point than the other RF amplification stages of the multiple stages 602–606 due to a variation in the stage's bias and decoupling circuitry 616–626 or output matching circuitry 634–638.

The input matching circuit 610–614 of each RF amplification stage 602–606 is coupled to quadrature modulator 220 by an input RF switching device 608. The output matching circuit 634–638 of each RF amplification stage 602–606 is coupled to the output port of PA 222 by an output RF switching device 640. Each input and output RF switching device 608, 640 is further coupled to PA efficiency circuit 240, and is enabled and disabled by the above described method-of-operation signals generated by the PA efficiency circuit. By enabling and disabling the input and output switching devices 608, 640 in each RF amplification stage 602–606, PA efficiency circuit 240 may couple and decouple each stage to feedback loop 210. By variously coupling different stages 602–606 to feedback circuit 210, the operating point of PA 222 may be adjusted. For example, when transmitter 106 is operating in an open loop mode, PA efficiency circuit 240 may switch in a high linearity/low efficiency RF amplification stage. When transmitter 106 switches to closed loop operation, PA efficiency circuit 240 may switch in a lower linearity/higher efficiency RF amplification stage.

The above processes of running open loop for one or more time slots at a high linearity/low efficiency PA bias level and phase training and power leveling feedback loop 210 during open loop operation, and then closing feedback loop 210 and adjusting a PA 222 operating point to a lower linearity/higher efficiency operating point, may be repeated during the course of an active communication. By repeating the above processes during the course of an active communication, linear transmitter 106 can foreclose any tendency for the phase of the feedback path to diverge from an optimal alignment during the communication.

In still another alternative embodiment of the present invention, transmitter 106 may frequency hop in order to combat interference. Frequency hopping involves changing the transmit frequency of transmitter 106 during the transmission in a predetermined manner. Preferably, the frequency of transmitter 106 is changed between transmit time slots. A change in a frequency of transmitter 106 causes a corresponding change in a phase of transmitter 106 and in a phase shift introduced to a signal by the transmitter. The phase change is a linear function of the operating frequency of transmitter 106.

Various methods of estimating the phase of transmitter 106 corresponding to a change in transmit frequency are described in detail in U.S. Pat. No. 5,574,992, entitled "Method and Apparatus for Reducing Off-Channel Interference Produced by a Linear Transmitter," which patent is assigned to the assignee of the present invention and is hereby incorporated herein in its entirety. The patent provides methods by which a phase of transmitter 106 can be estimated by an equation that is a function of multiple environmental variables, such as temperature (T), supply voltage (V), and frequency (F). For example, one such equation is "Phase=$C1*V^2+C2*V+C3*T^2+C4*T+C5F+C6$," (equation 1) wherein 'C1,' 'C2,' 'C3,' 'C4,' 'C5,' and 'C6' are constant coefficients corresponding to each variable.

In the present invention, a linear relation between frequency and phase is exploited in order to produce a first estimate of a phase shift corresponding to transmitter 106 after a frequency hop. Since frequency hopping occurs over a very short time period, the influence of each of environmental variables C1–C4 can be ignored. The constant C6 is also superfluous since a phase of feedback loop 210 and a frequency preceding the hop (respectively denoted 'Phase1' and 'F1'), that is, at the end of an immediately preceding transmit time slot, are already known. A result is an equation that may be used to estimate a phase, 'Phase2,' for a new frequency, 'F2,' "Phase1−Phase2=$C5*(F1−F2)$." (equation 2)

The constant C5 can be estimated by several techniques. The initial C5 estimate can be determined in a factory calibration or can be dynamically determined by DSP 254 during power up by acquiring phase at several different transmit frequencies and estimating C5 as the slope of a least squares fit of phase versus frequency. The phase estimates at each frequency can be done using the adaptive phase estimation techniques described in either the above referenced U.S. Pat. No. 5,675,286 or in U.S. Pat. No. 5,134,718, entitled "Fast Phase Shift Adjusting Method and Device for Linear Transmitter." U.S Pat. No. 5,134,718 is assigned to the assignee of the present invention and is hereby incorporated herein in its entirety. The estimates are then stored in the memory associated with DSP 254. Alternatively, the C5 estimate can be improved after transmitter 106 has closed feedback loop 210 and has had enough time to reach a steady state phase estimation (typically on the order of a few dozen slots). Once the closed loop phase estimation is near steady state, DSP 254 can make small corrections in C5 in order to obtain a better estimate of C5. Techniques for adaptively modifying C5 based on phase measurements performed by DSP 254 are described in the above referenced U.S. Pat. No. 5,574,992.

The parameter C5 is likely to be a function of other environmental variables that are typically monitored by communication device 100 such as a supply voltage and a communication device 100 operating temperature. Table look-ups for C5 can be created based on the values of these environmental variables, wherein a relationship between a frequency change and a phase change "$\Delta phase = C5 * \Delta F$," (equation 3) is determined and stored in the memory associated with DSP 254. When transmitter 106 frequency hops, an initial phase estimate for the new phase corresponding to transmitter 106 (i.e., Phase2) may be provided by the above 'equation 2' or 'equation 3.' The initial phase estimate for the new phase is then used by controller 250 to adjust the phase shift introduced to a reference signal by phase adjustment circuit 230 and thereby to adjust the phase of sampled output signal 227 that is fed back to summing junction 216. Use of an initial phase estimate improves the convergence of the open and closed loop adaptive phase estimation performed by adapter module 262 and reduces a phase variance of transmitter 106. Decreasing the phase variance will decrease off channel splatter.

For example, the initial phase can be estimated during the first few open loop slots as follows. During the first open loop transmit time slot, transmitter 106 is operating at a first frequency 'F1.' Estimation of an open loop phase then begins converging on an optimum phase. At the end of the first slot, the open loop phase estimation is at a phase 'Phase1.' Transmitter 106 then goes out of the first transmit time slot and changes to a second frequency 'F2.' The initial estimate for the new phase, 'Phase2,' corresponding to the new frequency F2 can then be determined as "$Phase2 = Phase1 - C5*(F1-F2)$." (equation 4)

In general, by providing for operation of PA 222 at a first, highly linear operating point when phase training and power leveling an open feedback loop, and then closing the feedback loop and adjusting to a less linear, higher efficiency operating point, the present invention provides a high efficiency, highly linear transmitter 106. The first operating point causes an introduction of a minimal amount of distortion into an input signal being amplified by PA 222, so that transmitter 106 can operate open loop and still meet the stringent off channel interference and EVM requirements of new cellular system standards. However, transmitter 106 does so at the expense of operating at a lower efficiency and at a significantly backed off output power level. The second operating point results in the introduction of a greater amount of distortion to an input signal during amplification than the first operating point. However, the additional distortion is corrected by the closed feedback loop so that the stringent off channel interference and EVM requirements of new cellular system standards continue to be met. By allowing the transmitter to operate at a less linear, higher efficiency operating point, the invention reduces the amount of heat dissipated by the transmitter during transmission of a signal and increases the lifetime of a limited life power supply such as a battery.

The present invention further minimizes a potential for a generation of off channel interference by providing for an estimation of a change in a phase of transmitter 106 corresponding to a change in transmit frequency. When transmitter 106 frequency hops, the phase of the transmitter changes. The phase change can create an undesired mismatch of the phases of the feedback and feedforward signals at summing junction 216 and can generate off channel splatter. To minimize the potential for a mismatch and splatter, the present invention provides for the estimation of the phase change due to a frequency hop. The estimation is then used for an initial adjustment of the phase of the reference signal, and thereby an initial adjustment of the phase of the feedback signal, at the beginning of the first transmit time slot after the frequency hop.

Figure 7:
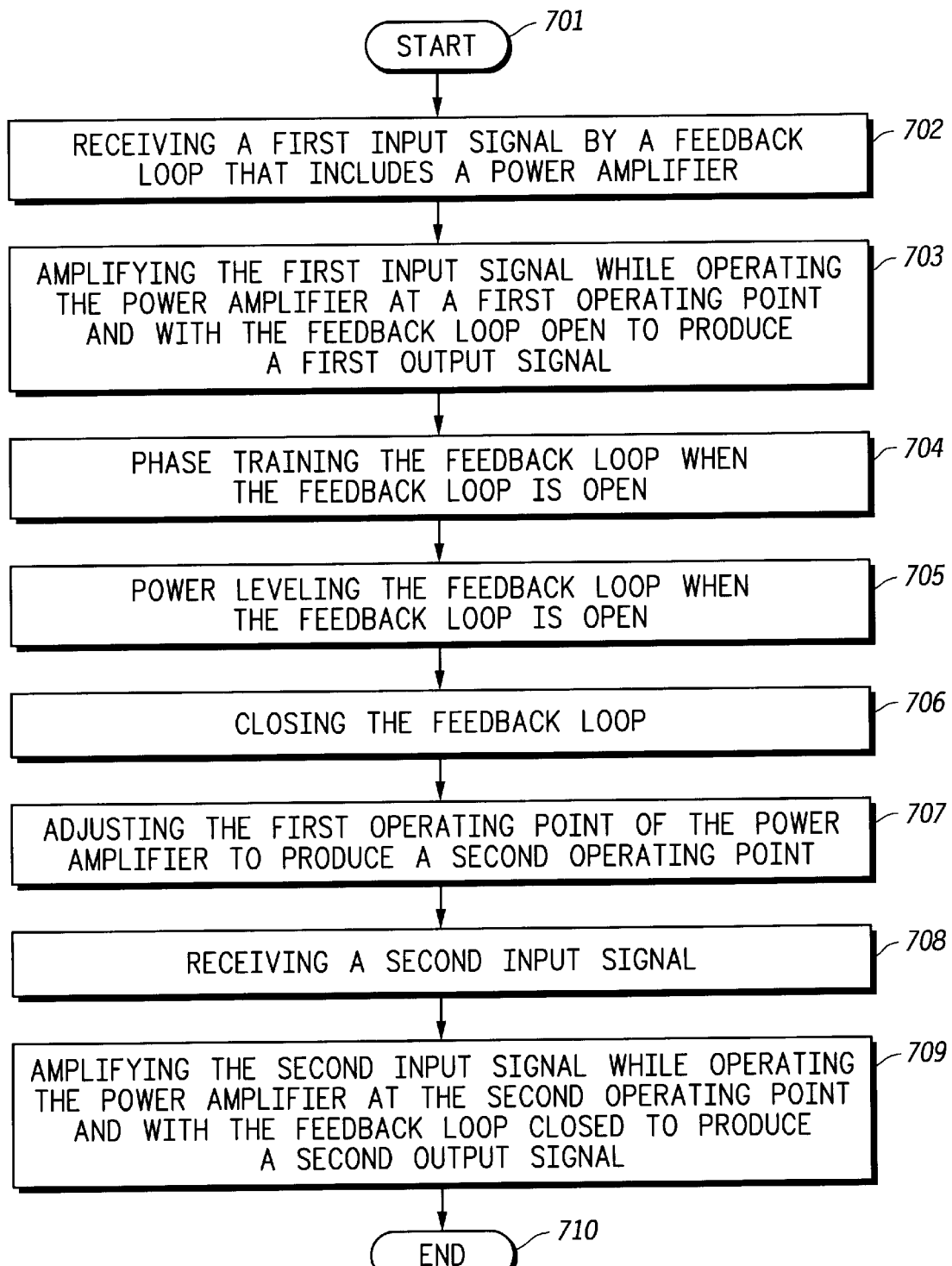
FIG. 7 is a logic flow diagram of the steps executed by a linear transmitter in amplifying a radio frequency signal in accordance with the present invention.

FIG. 7 is a logic flow diagram 700 of steps executed by a linear transmitter having a feedback loop that includes a forward path coupled to a feedback path, wherein the forward path comprises a power amplifier that includes an input port, an output port, and an RF amplifying element, in order to amplify a radio frequency signal in accordance with a preferred embodiment of the present invention. The logic flow begins (701) when the transmitter receives (702) a first input signal, preferably a complex digital baseband input signal that is received from an information source such as a DSP. The transmitter amplifies (703) the first input signal while operating the power amplifier at a first operating point and with the feedback loop open to produce a first output signal. In the preferred embodiment, the first operating point is a highly linear operating point, such as a class A bias of the power amplifier, that minimizes the off channel interference produced by the amplification of the input signal.

When operating open loop, the transmitter further phase trains (704) the feedback loop. In the preferred embodiment, the step of phase training (704) includes steps of sampling the first output signal to produce a sampled output signal and routing the sampled output signal to an auxiliary loop via the feedback path. The auxiliary loop compares the sampled output signal to a desired input signal, which desired input signal is preferably the complex digital baseband input signal that is sourced by the DSP. Preferably the sampled output signal is digitized, normalized based on a determined magnitude of the desired input signal, and adjusted, or corrected, for a direct current offset in the sampled output signal, before being compared to the desired input signal. Based on the comparison of the sampled output signal and the desired input signal, the transmitter, preferably the auxiliary loop, determines a phase error. The transmitter then adjusts a phase of the feedback path based on the phase error.

Preferably, the step of adjusting a phase of the feedback path based on the phase error comprises steps of producing a control signal based on the phase error and adjusting a phase of a reference signal based on the control signal. In the preferred embodiment, the power amplifier amplifies an input signal to produce an output signal at the output port of the amplifier. The output signal is sampled and fed back to a summing junction in the forward path. The summing junction is coupled to the feedback path and is further coupled to the input port of the power amplifier via a quadrature modulator. The reference signal is sourced by a local oscillator to the feedback path, where the reference signal is used to downconvert the sampled out put signal. By adjusting a phase of the reference signal, the invention adjusts a phase of the downconverted sampled output signal, which downconverted sampled output signal is conveyed by the feedback path to the summing junction for correction of distortion introduced to an input signal amplified by the power amplifier during closed loop operation of the transmitter.

Preferably, the transmitter also power levels (705) the feedback loop when the feedback loop is open. The step of power leveling includes the step of adjusting the magnitude of the input signal in order to set a desired output power level of the transmitter.

The transmitter then closes (706) the feedback loop, preferably by closing multiple switching devices that couple, when closed, and decouple, when open, the feedback path to an input to the power amplifier, and by opening a switching device that allows the forward path to bypass the feedback path when closed. When the feedback loop is closed, the transmitter adjusts (707) the first operating point of the power amplifier to produce a second operating point, wherein the second operating point is different than the first operating point. Preferably, the step of adjusting the first operating point includes a step of adjusting a supply voltage of the power amplifier, such that the first operating point includes a higher supply voltage, a higher linearity bias level, and a lower efficiency than the second operating point.

In other embodiments of the present invention, the step of adjusting the first operating point may include a step of adjusting bias voltage and current of the power amplifier or a step of adjusting a load coupled to the output port of the power amplifier. In yet another embodiment, the step of adjusting the first operating point may include steps of decoupling a first load and coupling a second load to the output port of the power amplifier, such that the first operating point is a higher linearity and a lower efficiency operating point than the second operating point. In still another embodiment, the power amplifier may include multiple parallel RF amplifying elements that are each biased at a different bias level or that each include a different output matching network, and thereby are each presented with a different load. The step of adjusting the first operating point may then include steps of decoupling a first RF amplifying element of the multiple parallel RF amplifying elements from the feedback loop and coupling a second RF amplifying element of the multiple parallel RF amplifying elements to the feedback loop, wherein the second RF amplifying element operates at a lower linearity/higher efficiency operating point than the first RF amplifying element. The transmitter then receives (708) a second input signal and amplifies (709) the second input signal while operating the power amplifier at the second operating point and with the feedback loop closed to produce a second output signal, and the logic flow ends (710).

Preferably the second operating point is a less linear, higher efficiency operating point than the first operating point. The first operating point causes an introduction of a minimal amount of distortion into the input signal during amplification by the power amplifier, so that the transmitter can operate open loop and still meet the stringent and EVM requirements of new cellular system standards. However, the transmitter does so at the expense of operating at a lower efficiency and at a backed off output power level. While operating open loop, the transmitter phase trains the feedback loop in order to properly align the phase delay of the feedback path and a fed back sampled output signal with the phase of an input signal at the point that the two signals are summed together and also sets the power level for the feedback loop. The transmitter then closes the feedback loop and adjusts the power amplifier operating point to a less linear and higher efficiency operating point. The transmitter may also adjust the magnitude of the input signal in order to maintain the output power level.

The second operating point results in the introduction of a greater amount of distortion to an input signal during amplification than the first operating point. The additional distortion is corrected by the closed feedback loop so that the stringent and EVM requirements of new cellular system standards continues to be met during closed loop operation. By allowing the transmitter to operate at a less linear, higher efficiency operating point, the invention reduces the amount of heat dissipated by the transmitter during transmission of a signal and increases the lifetime of a limited life power supply such as a battery.

In another embodiment of the present invention, the linear transmitter further performs steps that reduce off channel splatter during a frequency hop. The linear transmitter, preferably the auxiliary loop, further determines a phase change of the linear transmitter that corresponds to a change in a transmit frequency of the linear transmitter. When the linear transmitter changes from a first transmit frequency to a second transmit frequency (i.e., frequency hops from the first frequency to the second frequency), the linear transmitter, preferably the auxiliary loop via a phase adjustment circuit coupled to the auxiliary loop and the feedback path coupled to the a phase adjustment circuit, adjusts a phase of the feedback path based on the determined phase change.

While the present invention has been particularly shown and described with reference to particular embodiments thereof, it will be understood by those skilled in the art that various changes in form and details may be made therein without departing from the spirit and scope of the present invention.

We claim:

1. A linear transmitter comprising:
   an amplifier feedback loop comprising:
      a power amplifier that receives and amplifies an input signal to produce an output signal, wherein the power amplifier comprises an input port and an output port;
      a feedback circuit coupled to the output port of the power amplifier that samples the output signal to produce a sampled output signal;
      a plurality of switching devices that couple the feedback circuit to, and decouple the feedback circuit from, the input port of the power amplifier;
   an auxiliary loop coupled to the amplifier feedback loop that receives the sampled output signal from the feedback loop, compares the sampled output signal to a desired input signal, determines a phase error based on the comparison of the sampled output signal to the desired input signal, and aligns a phase of the sampled output signal with a phase of the input signal based on the phase error; and
   wherein the power amplifier operates at a first operating point when decoupled at the input port from the feedback circuit, wherein the power amplifier operates at a second operating point when coupled at the input port to the feedback circuit, and wherein the first operating point is different than the second operating point.

2. The linear transmitter of claim 1, wherein the auxiliary loop further produces a control signal based on the phase error, and wherein the linear transmitter further comprises a phase adjustment circuit coupled between the auxiliary loop and the feedback circuit that receives the control signal from the auxiliary loop and adjusts a phase of the feedback circuit based on the control signal.

3. The linear transmitter of claim 1, wherein the auxiliary loop comprises:
   a magnitude detection module that receives a desired input signal, detects a magnitude of the desired input signal, and conveys the detected magnitude to an adapter module;
   a delay module that that receives a desired input signal and adds a phase delay to the desired input signal to produce a phase delayed desired input signal;
   an offset and scale module that receives the sampled output signal and produces a magnitude scaled and offset adjusted sampled output signal in response to a magnitude adjustment signal and a DC offset adjustment signal received from the adapter module;
   a summing junction module in communication with the offset and scale module and the delay module that receives the phase delayed desired input signal, receives magnitude scaled and offset adjusted sampled output signal from the offset and scale module, and sums the phase delayed desired input signal and the magnitude scaled and offset adjusted sampled output signal to produce an error signal; and
   an adapter module in communication each of the offset and scale module, the delay module, the magnitude detection module, and the summing junction module, that receives the phase delayed desired input signal, receives the detected magnitude of the desired input signal from the magnitude detection module, receives the error signal from the summing junction, determines a magnitude adjustment signal based on the magnitude of the desired input signal, determines a DC offset adjustment signal based on the error signal, and produces a control signal based on the error signal.

4. The linear transmitter of claim 3, wherein the control signal comprises a phase control signal and a magnitude control signal.

5. The linear transmitter of claim 4, further comprising a scaling attenuator coupled to the amplifier feedback loop and to the auxiliary loop, wherein the scaling attenuator receives an input signal sourced by an information source, receives the magnitude error control signal from the auxiliary loop, attenuates the input signal based on the magnitude control signal, and conveys the attenuated input signal to the amplifier feedback loop, and wherein the drive signal received by the power amplifier is based on the attenuated input signal.

6. The linear transmitter of claim 1, wherein the power amplifier comprises a plurality of input ports, wherein a first input port of the plurality of input ports receives a drive signal and is coupled to the feedback circuit via at least one switching device of the plurality of switching devices, and wherein a second input port of the plurality of input ports receives a control signal that controls the operating point of the power amplifier.

7. The linear transmitter of claim 6, further comprising a power amplifier efficiency circuit coupled to the second input port that sources a first supply voltage and a first supply current and a second supply voltage and a second supply current to the power amplifier, wherein the first supply voltage and the first supply current establish the first operating point of the power amplifier, wherein the second supply voltage and the second supply current establish the second operating point of the power amplifier, and wherein the first operating point is different than the second operating point.

8. The linear transmitter of claim 6, further comprising a power amplifier efficiency circuit coupled to the second input port that sources a first bias voltage and a first bias current and a second bias voltage and a bias supply current to the power amplifier, wherein the first bias voltage and the first bias current establish the first operating point of the power amplifier, wherein the second bias voltage and the second bias current establish the second operating point of the power amplifier, and wherein the first operating point is different than the second operating point.

9. The linear transmitter of claim 1, wherein the auxiliary loop phase trains the feedback circuit when the feedback circuit is decoupled from the input port of the power amplifier.

10. The linear transmitter of claim 1, wherein the power amplifier comprises a radio frequency (RF) amplifying element and an output matching circuit, wherein the output matching circuit presents an adjustable load to the RF amplifying element, and wherein the first operating point is established by adjusting the adjustable load to a first complex impedance and wherein the second operating point is established by adjusting the adjustable load to a second complex impedance.

11. The linear transmitter of claim 1, further comprising a plurality of power amplifier load circuits, wherein each power amplifier load circuit of the plurality of power amplifier load circuits is capable of being coupled to, and decoupled from, the output port of the power amplifier, wherein each power amplifier load circuit comprises a complex impedance circuit, wherein the first operating point is established by coupling a first power amplifier load circuit of the plurality of power amplifier load circuits to the output port, and wherein the second operating point is established by coupling a second power amplifier load circuit of the plurality of power amplifier load circuits to the output port.

12. The linear transmitter of claim 1, wherein the power amplifier comprises a plurality of radio frequency (RF) amplifying elements, wherein each RF amplifying element of the plurality of RF amplifying elements is capable of being coupled to, and decoupled from, the amplifier feedback loop, wherein each RF amplifying element is biased at a bias level different from the other RF amplifying elements, wherein the first operating point is established by coupling a first RF amplifying element of the plurality of RF amplifying elements to the feedback loop, and wherein the second operating point is established by coupling a second RF amplifying element of the plurality of RF amplifying elements to the feedback loop.

13. The linear transmitter of claim 1, wherein the power amplifier comprises a plurality of radio frequency (RF) amplifying elements, wherein each RF amplifying element of the plurality of RF amplifying elements is capable of being coupled to, and decoupled from, the feedback loop, wherein each RF amplifying element includes an output matching circuit, wherein the output matching circuit associated with each RF amplifying element presents a load to the RF amplifying element that is different from the load presented by the other output matching circuits to each of the other RF amplifying elements, wherein the first operating point is established by coupling a first RF amplifying element of the plurality of RF amplifying elements to the feedback loop, and wherein the second operating point is established by coupling a second RF amplifying element of the plurality of RF amplifying element to the feedback loop.

14. The linear transmitter of claim 1, wherein the auxiliary loop further determines a phase change of the linear transmitter that corresponds to a change in a transmit frequency of the linear transmitter and, when the linear transmitter changes from a first transmit frequency to a second transmit frequency, aligns a phase of the sampled output signal with a phase of the input signal based on the determined phase change.

15. A communication device comprising:
an information source that sources an input signal;
an amplifier feedback loop coupled to the information source that comprises:
  a power amplifier that receives and amplifies the input signal to produce an output signal, wherein the power amplifier comprises an input port and an output port;
  a feedback circuit coupled to the output port of the power amplifier that samples the output signal to produce a sampled output signal;
  a plurality of switching devices that couple the feedback circuit to, and decouple the feedback circuit from, the input port of the power amplifier;
an auxiliary loop coupled to the information source and to the amplifier feedback loop that receives the sampled output signal from the feedback loop, compares the sampled output signal to a desired input signal, determines a phase error based on the comparison of the sampled output signal to the desired input signal, and aligns a phase of the sampled output signal with a phase of the input signal based on the phase error;
a processor coupled to the amplifier feedback loop and to the auxiliary loop that couples and decouples the feedback circuit to the power amplifier by controlling each switching device of the plurality of switching devices; and
wherein the power amplifier operates at a first operating point when decoupled at the input port from the feedback circuit, wherein the power amplifier operates at a second operating point when coupled at the input port to the feedback circuit, and wherein the first operating point is different from the second operating point.

16. The communication device of claim 15, further comprising a power amplifier efficiency circuit coupled to the processor and to the power amplifier that sources a first supply voltage and a first supply current and a second supply voltage and a second supply current to the power amplifier in response to control signals received from the processor, wherein the first supply voltage and the first supply current establish the first operating point of the power amplifier, wherein the second supply voltage and the second supply current establish the second operating point of the power amplifier, and wherein the first operating point is different than the second operating point.

17. The communication device of claim 15, wherein the auxiliary loop further determines a phase change of the linear transmitter that corresponds to a change in a transmit frequency of the linear transmitter and, when the linear transmitter changes from a first transmit frequency to a second transmit frequency, aligns a phase of the sampled output signal with a phase of the input signal based on the determined phase change.

18. A method for amplifying a radio frequency signal in a transmitter having a feedback loop that comprises a forward path coupled to a feedback path, wherein the forward path comprises a power amplifier, the method comprising steps of:
receiving a first input signal;
amplifying the first input signal while operating the power amplifier at a first operating point and with the feedback loop open to produce a first output signal;
closing the feedback loop;
adjusting the first operating point of the power amplifier to produce a second operating point, wherein the second operating point is different than the first operating point;
receiving a second input signal;
amplifying the second input signal while operating the power amplifier at the second operating point and with the feedback loop closed to produce a second output signal.

19. The method of claim 18, wherein the first operating point is a higher linearity operating point than the second operating point.

20. The method of claim 18, further comprising a step of phase training the feedback loop when the feedback loop is open.

21. The method of claim 20, wherein the step of phase training comprises steps of:
sampling the first output signal to produce a sampled output signal;
comparing the sampled output signal to a desired input signal;
determining a phase error based on the comparison of the sampled output signal and the desired input signal; and
adjusting a phase of the feedback path based on the phase error.

22. The method of claim 21, wherein the step of adjusting a phase of the feedback path based on the phase error comprises steps of:
producing a control signal based on the phase error; and
adjusting a phase of a reference signal based on the control signal, wherein the reference signal is used to downconvert a signal in the feedback path.

23. The method of claim 21, wherein the step of comparing the sampled output signal to a desired input signal comprises steps of:
determining a magnitude of a desired input signal;
scaling a magnitude of the sampled output signal based on the determined magnitude of the desired input signal;
adjusting a direct current offset of the sampled output signal; and
comparing the magnitude scaled and direct current offset adjusted sampled output signal to the desired input signal.

24. The method of claim 18, further comprising a step of power level setting the transmitter while the transmitter is operating with the feedback loop open.

25. The method of claim 18, further comprising steps of:
determining a phase change of the linear transmitter that corresponds to a transmit frequency change of the linear transmitter; and
when the linear transmitter changes from a first transmit frequency to a second transmit frequency, adjusting a phase of the feedback path based on the determined phase change.

* * * * *